United States Patent
Voldman (10) Patent No.: US 6,331,726 B1
(45) Date of Patent: Dec. 18, 2001

(54) SOI VOLTAGE DEPENDENT NEGATIVE-SATURATION-RESISTANCE RESISTOR BALLASTING ELEMENT FOR ESD PROTECTION OF RECEIVERS AND DRIVER CIRCUITRY

(75) Inventor: Steven H. Voldman, So. Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/532,128

(22) Filed: Mar. 21, 2000

(51) Int. Cl.[7] .............................. H01L 29/00; H01L 23/62
(52) U.S. Cl. .................... 257/541; 257/358; 257/360; 257/363
(58) Field of Search ............................ 257/173, 174, 257/358, 359, 360, 363, 541

(56) References Cited

U.S. PATENT DOCUMENTS

| | | |
|---|---|---|
| 4,605,980 * | 8/1986 | Hartranft et al. . |
| 4,876,584 * | 10/1989 | Taylor . |
| 5,218,222 | 6/1993 | Roberts . |
| 5,489,792 | 2/1996 | Hu et al. . |
| 5,545,910 | 8/1996 | Jang . |
| 5,610,790 | 3/1997 | Staab et al. . |
| 5,679,593 | 10/1997 | Miller, Jr. et al. . |
| 5,696,398 | 12/1997 | Yamamoto . |
| 5,804,861 | 9/1998 | Leach . |
| 5,814,865 * | 9/1998 | Duvvury et al. ................... 257/360 |
| 5,818,086 * | 10/1998 | Lin et al. ............................ 257/355 |
| 5,864,162 | 1/1999 | Reedy et al. . |

* cited by examiner

Primary Examiner—Ngân V. Ngô
(74) Attorney, Agent, or Firm—Rosenman & Colin, LLP.

(57) ABSTRACT

A ballasting resistor incorporating therein an H-shaped gate structure reduces a current therethrough by utilizing a pinching effect. The ballasting resistor is formed on a silicon-on-insulator substrate and includes a pair of $N^+$ regions, a $P^-$ body region formed between the NM regions, and a pair of $P^+$ nodes connected to the $P^-$ body region. The $P^-$ body region resides under the gate structure, which includes a thin dielectric layer formed on the $P^-$ body region and a conductive layer formed on the dielectric layer. The ballasting resistor is biased in such a manner that the P-N junctions are reverse-biased to pinch down the cross-sectional area of the current path provided inside the $P^-$ body region between the nodes as an applied voltage increases. The ballasting resistor has a MOS transistor-like structure; and, therefore, electrostatic discharge protection can be provided for the conventional SOI MOS circuits without requiring additional processing steps.

24 Claims, 14 Drawing Sheets

SOI VOLTAGE DEPENDENT NEGATIVE-SATURATION-RESISTANCE RESISTOR BALLASTING ELEMENT FOR ESD PROTECTION OF RECEIVERS AND DRIVER CIRCUITRY

FIELD OF THE INVENTION

The present invention relates to an electrostatic discharge (ESD) protection circuits; and, more particularly, to ballasting resistors for providing ESD protection for silicon on-insulator (SOI) devices.

DESCRIPTION OF THE PRIOR ART

MOSFET scaling on bulk silicon has been the primary focus of the semiconductor and microelectronics industry for achieving CMOS chip performance and density objectives. The shrinking of MOSFET dimensions for high density, low power and enhanced performance requires reduced power-supply voltages. Because power consumption (P) is a function of capacitance (C), power supply voltage (V) and transition frequency (f) where $P=fCV^2$, the focus has been on reducing both C and V as the transition frequency increases. The components of the MOSFET capacitance (C) consist of diffusion and gate capacitances. As a result, dielectric thickness and channel length are scaled with power-supply voltage. Power-supply reduction continues to be the trend for future low-voltage CMOS. However, with power-supply reduction, transistor performance is severely impacted by both junction capacitance and the MOSFET body effect at lower voltages. As technologies scale below 0.25 Tm channel lengths, to 0.15 and 0.1 Tm, short-channel effects control, gate resistance, channel profiling and other barriers become an issue for advanced CMOS technologies. While significant success has been achieved with successive scaling of bulk CMOS technology, the manufacturing control issues and power consumption will become more difficult to deal with.

Using silicon-on-insulator (SOI) substrates, many of the concerns and obstacles of bulk-silicon CMOS can be eliminated at low power-supply voltages. CMOS-on-SOI has significant advantages over bulk CMOS technology and will achieve the scaling objectives of low power and high performance for future technologies. CMOS-on-SOI provides low power consumption, low leakage current, low capacitance diode structures, good sub-threshold I–V characteristics (better than 60 mV/decade), a low soft error rate from both alpha particles and cosmic rays, good access times, and other technology benefits. SOI has not become a mainstream CMOS technology because of the rapid improvement in bulk CMOS technology performance, however, it is a future contender for mainstream CMOS applications. One of the barriers to implementing SOI is the "floating body" issue. Another barrier is electrostatic discharge protection (ESD).

Presently, there are multiple strategies for ESD protection of SOI structures. One of these is to use bulk ESD protection circuits on an SOI wafer. According to a semiconductor process proposed by Kawai, disclosed in U.S. Pat. No. 4,889,829, entitled "METHOD FOR PRODUCING A SEMICONDUCTOR DEVICE HAVING A SILICON-ON-INSULATOR STRUCTURE", bulk transistors are in the substrate and SOI transistors are on the insulating film. If this is possible, bulk ESD devices can be designed without any new SOI-specific ESD issues. This proposal has significant topography, which would make it unacceptable for high density and planarity integration issues. In addition, it forces special semiconductor processing for the sole purpose of providing ESD protection. Sun (U.S. Pat. No. 5,399,507 entitled "FABRICATION OF MIXED THIN FILM AND BULK SEMICONDUCTOR SUBSTRATE FOR INTEGRATED CIRCUIT APPLICATIONS") proposed a mixed thin film where ESD devices are constructed in bulk and where the oxygen implant is masked and SOI devices are built over the insulating layer. This concept eliminates planarity concerns but leads to silicon dislocation, which is unacceptable from a manufacturing perspective. A disadvantage of these bulk strategies is that charged-device model (CDM) failures can occur more frequently because ESD networks now are in bulk, whereas in an SOI technology, bulk substrate charging from CDM mechanisms is less of a concern. With SOI, significant freedom exists to develop bipolar technology side-by-side with CMOS technology. However, a significant cost results in each of these implementations, which is neither acceptable nor practical to address.

Another technique to limit the current through the transistors is to put an impedance in series with the MOSFET transistors, either by directly integrating it with the sources or drains of the MOSFETs, thereby adding drain or source resistances or building what is called standard resistors in series with these elements.

When these structures undergo thermal runaway, they typically find a defective or a hot spot which then leads to current constriction through a physically smaller region of the device, which is much physically smaller than the full width of transistor. So the technique to distribute the current through the full transistor and avoid thermal runaway is known as resistor ballasting.

Resistor ballasting is a technique which reduces a plurality of resistors with every leg of a transistor or subdivision of the transistor into multiple resistors in order to prevent the electric current constriction through a given defect in the MOSFET transistor during high current phenomenon.

Figure 1:
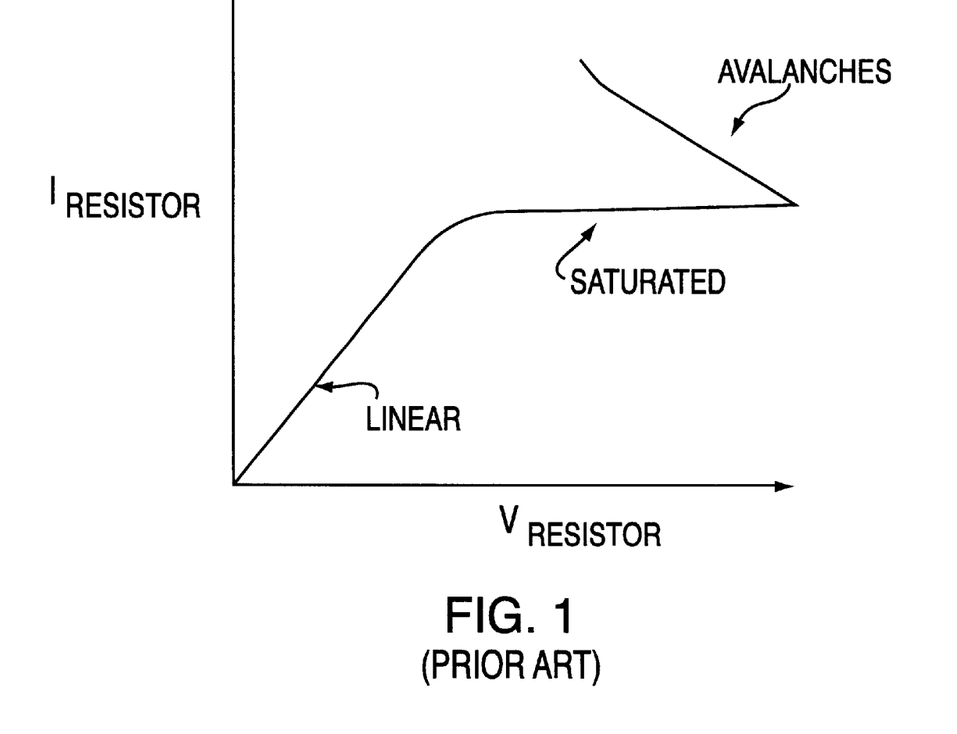
FIG. 1 shows an I/V curve illustrating a velocity saturation and a snap back of a conventional semiconductor resistor.

With the voltage at very low currents, any silicon bulk resistor would basically begin to follow Ohm's law, which is a linear characteristic, assuming that the velocity of carriers increases linear with the electric field. As the voltage increases, however, the relationship between the velocity and the electric field becomes non-linear to the saturation. So when electric field is high enough that the carriers undergo velocity saturation, these resistor elements have a tendency to saturate as shown in FIG. 1. As the voltage further increases, avalanche multiplication occurs across the resistor structure and actually get a snap-back phenomena in the resistor itself and it will undergo an avalanche process.

SUMMARY OF THE INVENTION

It is, therefore, an object of the present invention to provide an improved SOI (silicon-on-insulator) ESD (electrostatic discharge) protection device capable of increasing an impedance thereof as the voltage applied to a device or a circuit to be protected increases, thereby limiting the current through the circuit.

In accordance with one aspect of the present invention, there is provided a circuit comprising a device for limiting a current, further comprising:

a current path having a cross section for passing the current therethrough; and a pinching means responsive to an applied voltage for reducing the cross section as an amplitude of the applied voltage increases, thereby causing an impedance of the device to increase.

In accordance with another aspect of the present invention, there is provided a circuit comprising a device formed on an insulating layer for limiting a current, further comprising:

an input node and an output node formed of a semiconductor material of a first doping type;

plurality of discrete semiconductor regions of a second doping type; and a semiconductor region of the first doping type, the nodes and the semiconductor regions of the second doping type are coupled each other by the semiconductor region of the first doping type formed therebetween, wherein the semiconductor regions of the first and the second types are reverse-biased such that depletion regions inside the semiconductor region of the first doping type increase with an increasing amplitude of an applied voltage to thereby reduce a cross-sectional area through which the current passes.

Further, the present invention provides a structure comprising:

a substrate wafer;

a buried oxide layer on said substrate wafer;

a silicon film on said buried oxide layer;

a H-shape MOSFET gate structure with a gate dielectric;

a spacer;

a polysilicon film;

first and second doped regions of a first conductivity defined by said H-shape MOSFET gate structure;

a channel region of a second conductivity under said gate dielectric;

a first body contact of a second conductivity;

a second body contact of a second conductivity; and a resistive element formed between said first body contact and said second body contact.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Referring now to FIGS. 2 to 11, there are provided various diagrams illustrating inventive ballasting resistors for providing electrostatic discharge (ESD) protection for integrated circuits in accordance with preferred embodiments of the present invention. It should be noted that like parts appearing in FIGS. 2 to 11 are represented by like reference numerals.

Figure 2:
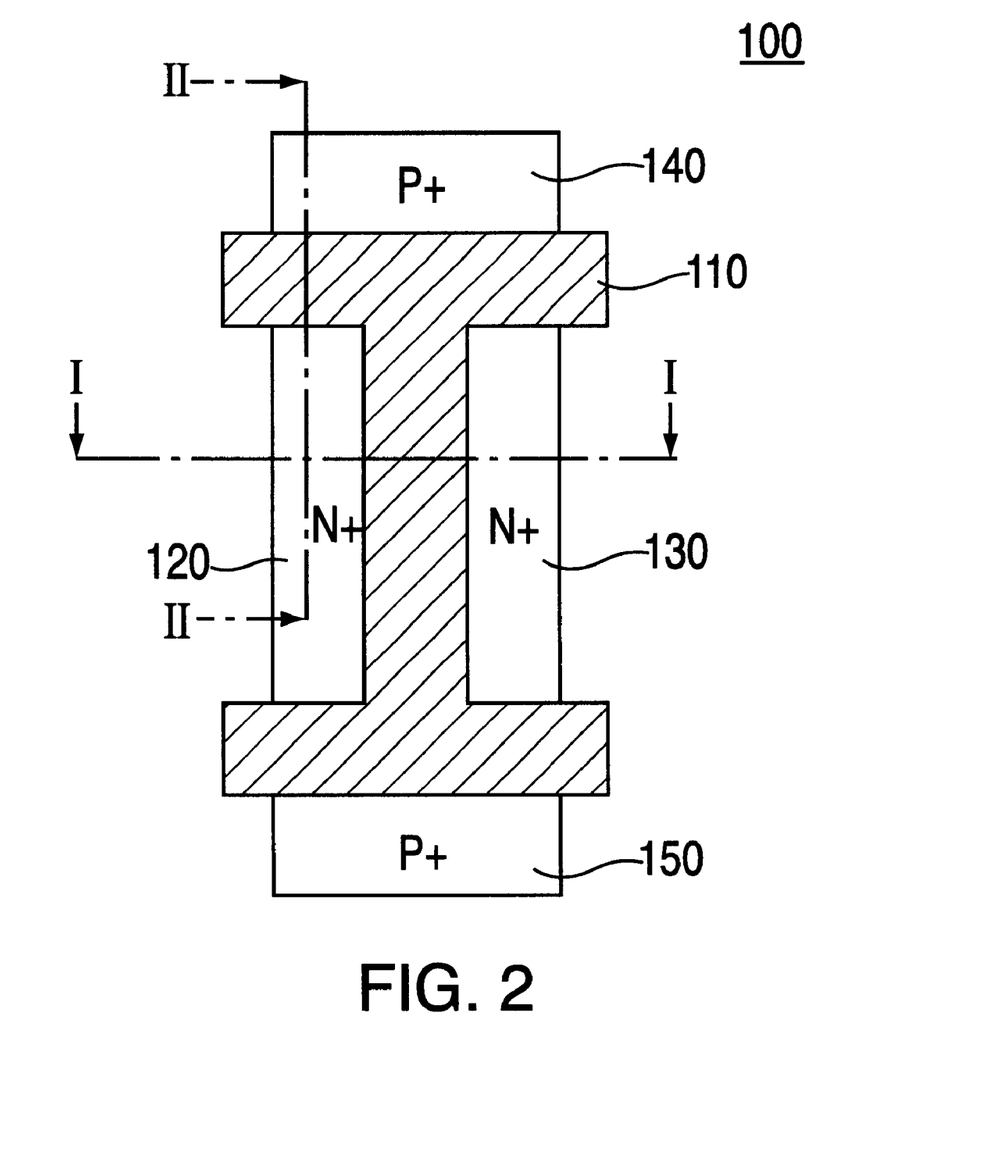
FIG. 2 is a plan view of a ballasting resistor in accordance with a first preferred embodiment of the present invention.

In FIG. 2, there is illustrated a plan view of a first preferred embodiment of a ballasting resistor 100 comprising an H or I-shaped gate structure 110, a pair of highly doped $N^+$ regions 120 and 130, and a pair of highly doped $P^+$ body contacts 140, 150, which serve as a pair of nodes. The H-shaped gate structure 110 is formed of a conductive material, e.g., a polysilicon, formed on a thin dielectric material, e.g., a gate-like oxide(not shown). The $P^+$ body contacts 140, 150 are to a top and a bottom sides of a $P^-$ body region under the H-shaped gate structure 110. Outside the resistor 100, there is formed an STI (shallow trench isolation) region(not shown).

As can be seen from the drawing, the resistor 100 has a MOS (metal-oxide-semiconductor) transistor-like structure along the line I—I. Current conduction in the resistor 100 of the present invention, however, is carried out between the nodes 140 and 150 via the $P^-$ body region under the gate structure 110. Further, the $N^+$ regions 120, 130 and the $P^-$ body region under the gate structure 110 are reverse-biased such that depletion regions due to the P-N junctions in the resistor 100 become widened as a voltage on the node 140 or 150 increases. In the inventive resistor 100, the $P^-$ body region under the gate structure 110 is lightly doped compared to the heavily doped $N^+$ regions 120, 130, so that most parts of the depletion regions reside within the $P^-$ body region. As a result, the current path inside the $P^-$ body region can be effectively pinch down with an increasing applied voltage on the node 140 or 150, causing the increase of the impedance of the resistor 100 to occur and limiting the current flow therethrough. Further, the H-shaped gate structure 110 can be based in such a way to pinch vertically from a top, so that the conduction path of the resistor 100 can be pinched down vertically by the gate structure 110 and laterally by the $N^+$ regions 120, 130.

The center portion of the ballasting resistor 100 is built with $P^+$, $P^-$ and $P^+$ which forms in cross sectional area of the ballasting resistor 100 through which the current flows. In parallel to that, there exist $P^+$, $P^-$ and $N^+$ regions between the nodes 140, 150 and the $N^+$ regions 120, 130. Thus, there are actually physical diodes, e.g., lateral diodes placed between the nodes 140 and 150. So basically, in this physical structure, the ballasting resistor 100 also has an additional ESD protection scheme built in the lateral diodes into this physical structure by forming the cross bars at the H-shaped polysilicon gate 110.

Figure 3A:
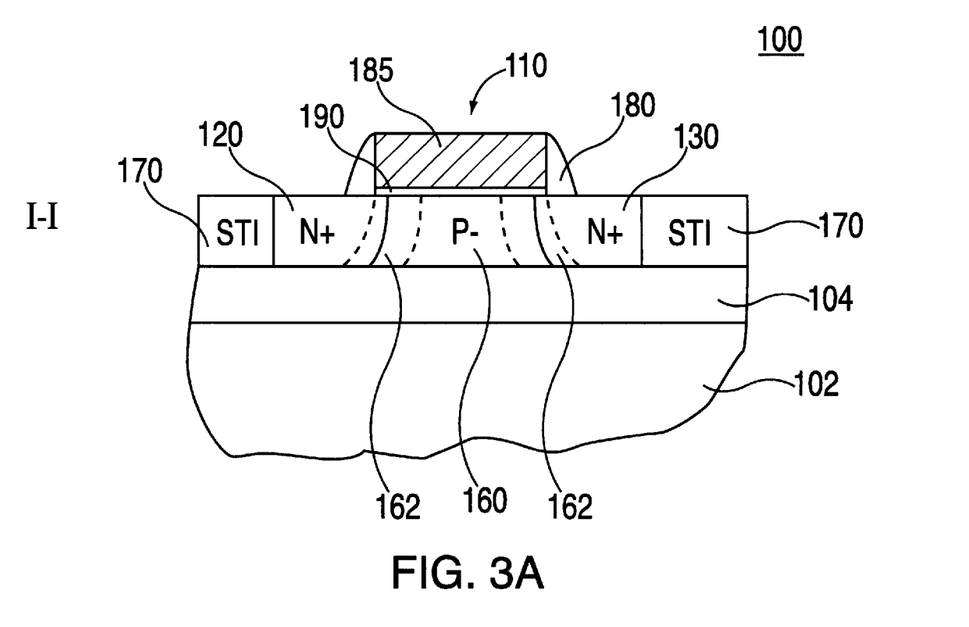
FIGS. 3A and 3B represent schematic cross-sectional views of the ballasting resistor shown in FIG. 2 having abrupt junctions.

FIG. 3A shows a schematic cross-sectional view of the ballasting resistor 100 having abrupt junctions in accordance with the first preferred embodiment of the present invention, taken along the line I—I shown in FIG. 2. The ballasting resistor 100 includes a semiconductor substrate 102, an embedded insulating layer 104 formed on top of the semiconductor substrate 102, a P⁻ body region 160 residing between the N⁺ 120, 130, a spacer 180 formed on the sidewall of the H-shaped gate structure 110. The gate structure 110 includes a dielectric layer 190 formed on the P⁻ body region 160 and a conductive layer 185 formed on the dielectric layer 190. The resistor 100 is formed within the region confined by the STI 170. As is shown in FIG. 3A, most parts of P-N junction depletion regions 162 are extended into the P⁻ body region 160.

Figure 3B:
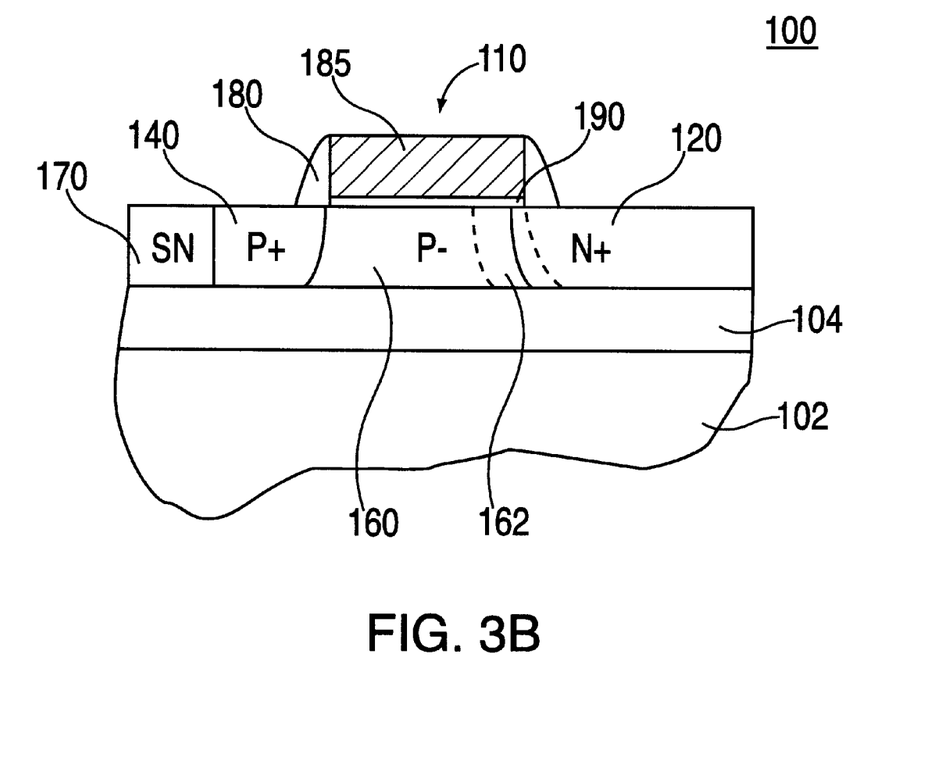

FIG. 3B shows a schematic cross-sectional view of the ballasting resistor 100 taken along the line II—II shown in FIG. 2 in accordance with the first preferred embodiment of the present invention.

Figure 4A:
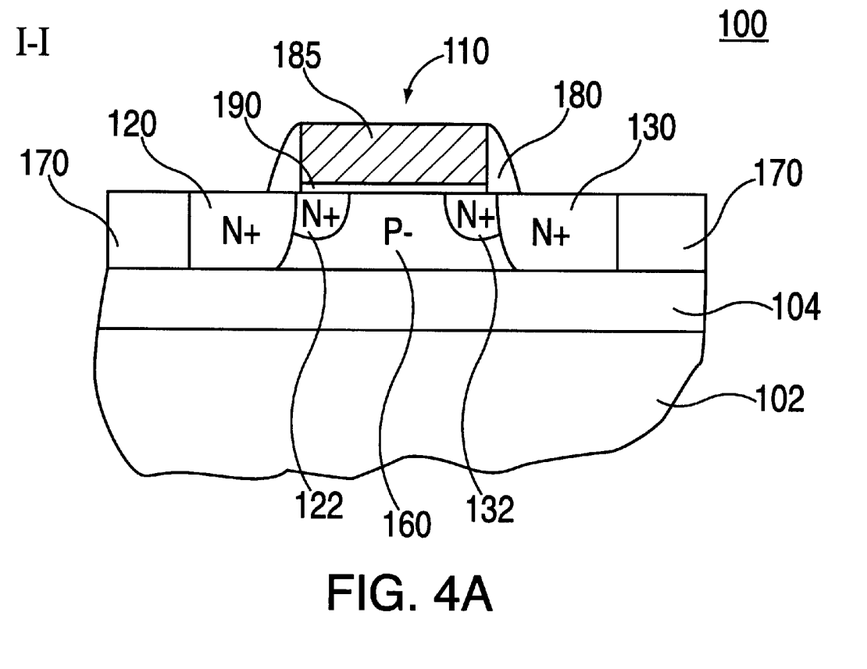
FIGS. 4A to 4C illustrate schematic cross-sectional views of the ballasting resistor shown in FIG. 2 with extension implants.
Figure 4B:
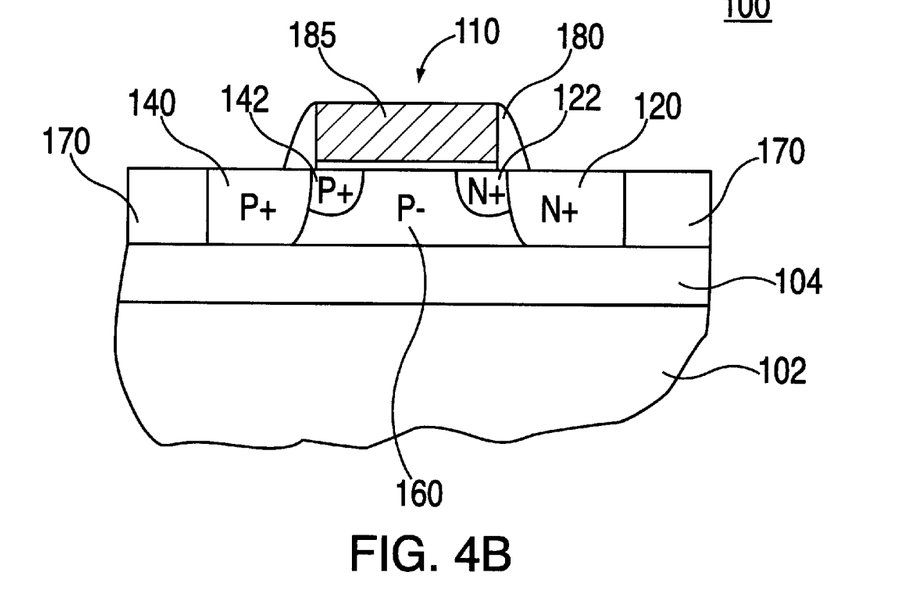
Figure 4C:
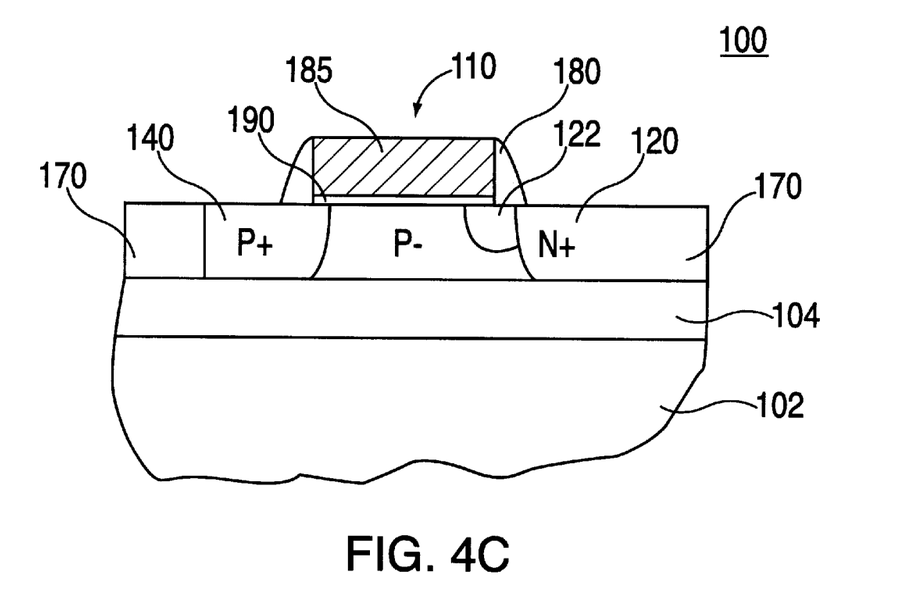

Alternatively, as in FIGS. 4A to 4C, the ballasting resistor 100 can be formed to have extension implants as in the conventional MOS transistors. The structure shown in FIG. 4A is basically identical to the one illustrated in FIG. 3A, excepting that extension implants 122 and 132 are extended from the upper parts of the N⁺ regions 120 and 130 into the P⁻ body region 160 below the edge parts of the gate structure 110. Similarly, the structure in FIG. 4B is identical to the one in FIG. 3B, excepting that extension implants 142 and 122 are extended from the node 140 and N⁺ region 120 into the P⁻ body region 160 the edge portions of the gate structure 110. FIG. 4C illustrates an alternative resistor structure in which the extension implant is extended only from the N⁺ region 120 and there exists no extension implant at the P⁺/P⁻ interface.

Figure 5:
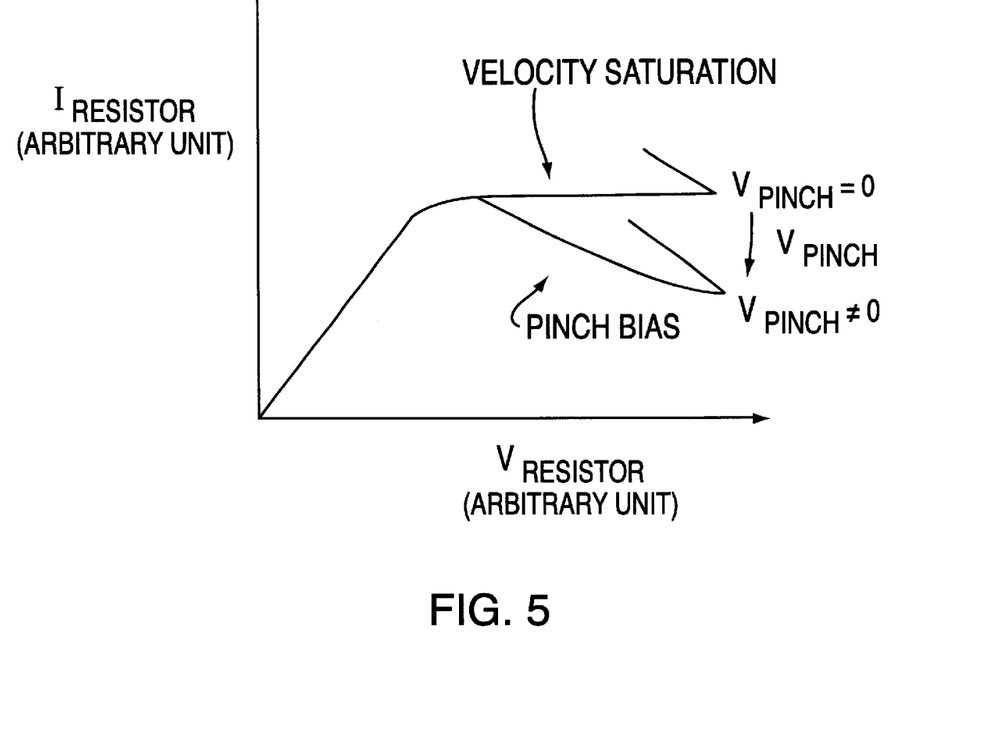
FIG. 5 exhibits an exemplary I/V curve representing pinching effect of the ballasting resistor in accordance with present invention.

FIG. 5 exhibits an exemplary current $I_{Resistor}$ versus a voltage $V_{Resistor}$ curve illustrating the I–V characteristic of the ballasting resistor 100 in accordance with present invention.

In the present invention, the doping concentration of the ballasting resistor 100 is chosen in such a way that the ballasting resistor 100 will go into saturation as the voltage on an input pad connected to one of the nodes 140 and 150 increases. Therefore, the ballasting resistor 100 will undergo a transition where no current increase occurs with increasing voltage in the absence of the pinching effect. In the present invention, however, the P⁻ body region 160 and the N⁺ regions 120, 130 are reverse-biased to produce the pinching effect. As a result, with the increase in the input pad voltage, a depletion region increases, causing a pinch-down or a constriction of the channel region.

That is, as the voltage applied on the input pad increases, the depletion region of the P⁻ body region 160 increases based on the applied voltages to decrease the physical sectional area that the current is flowing through. Therefore, the ballasting resistor 100 can effectively decrease the cross sectional area of the P⁻ body region 160 in such a way that the current actually decreases through the physical resistor when the voltage across the ballasting resistor 100 increases as shown in FIG. 5.

Figure 6A:
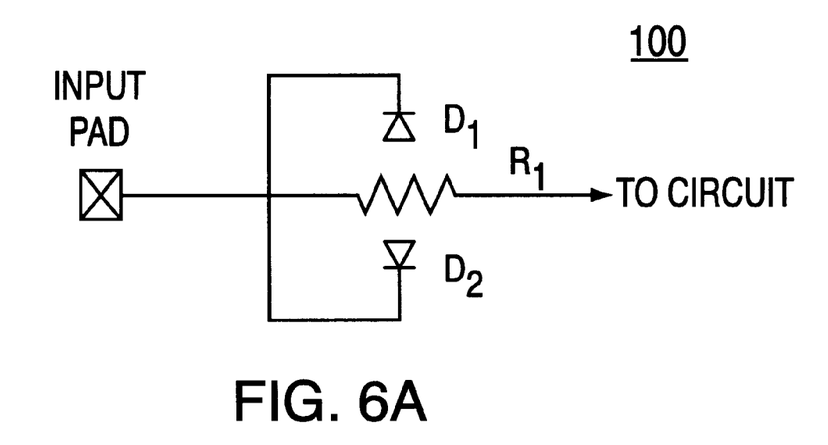
FIGS. 6A to 6C illustrate exemplary ESD protection circuits incorporating therein the ballasting resistor of the first preferred embodiment of the invention.
Figure 6B:
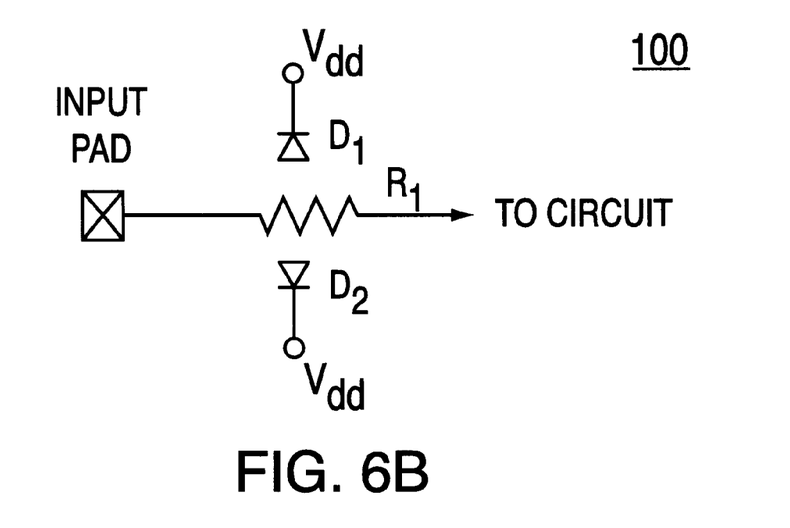
Figure 6C:
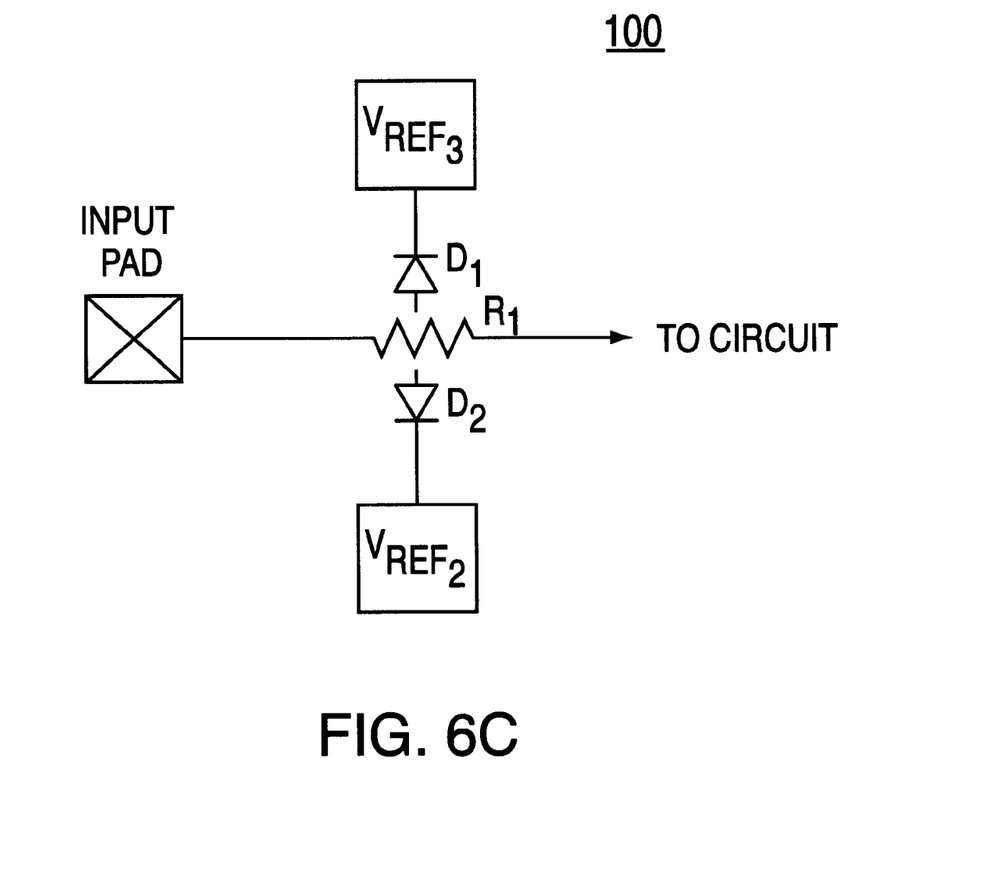

FIGS. 6A to 6C illustrate exemplary ESD protection circuits incorporating therein the ballasting resistor 100 shown in FIG. 2.

In FIG. 6A, the voltage from the input pad is applied to an end of the resistor $R_1$ having the structure shown in FIG. 2 and N⁺ regions 120, 130 of the diodes $D_1$ and $D_2$ formed by the Pbody region 160 and the N⁺ regions 120, 130. In this case, as the voltage on the input pad increases, the diodes $D_1$ and $D_2$ are reverse-biased and pinch down the resistor $R_1$ which is bounded by two N⁺ diffusions on its sides. Therefore, as the voltage on the input pad increases, basically the region of the resistor $R_1$ will start pinching down, leading to the kind of characteristic shown in FIG. 5 and reducing the current through the resistor $R_1$ to protect a circuit connected to the other end of the resistor $R_1$ from an ESD. On the other hand, a voltage $V_{dd}$ which is from the voltage applied to the input pad can be applied to the diodes $D_1$ and $D_2$, as shown in FIG. 6B.

Further, as shown in FIG. 6C, two different reference voltages $V_{ref1}$ and $V_{ref2}$ can be applied to the diodes $D_1$ and $D_2$, respectively, and can be differently controlled to pinch down the resistor $R_1$ in accordance with the present invention.

Figure 7:
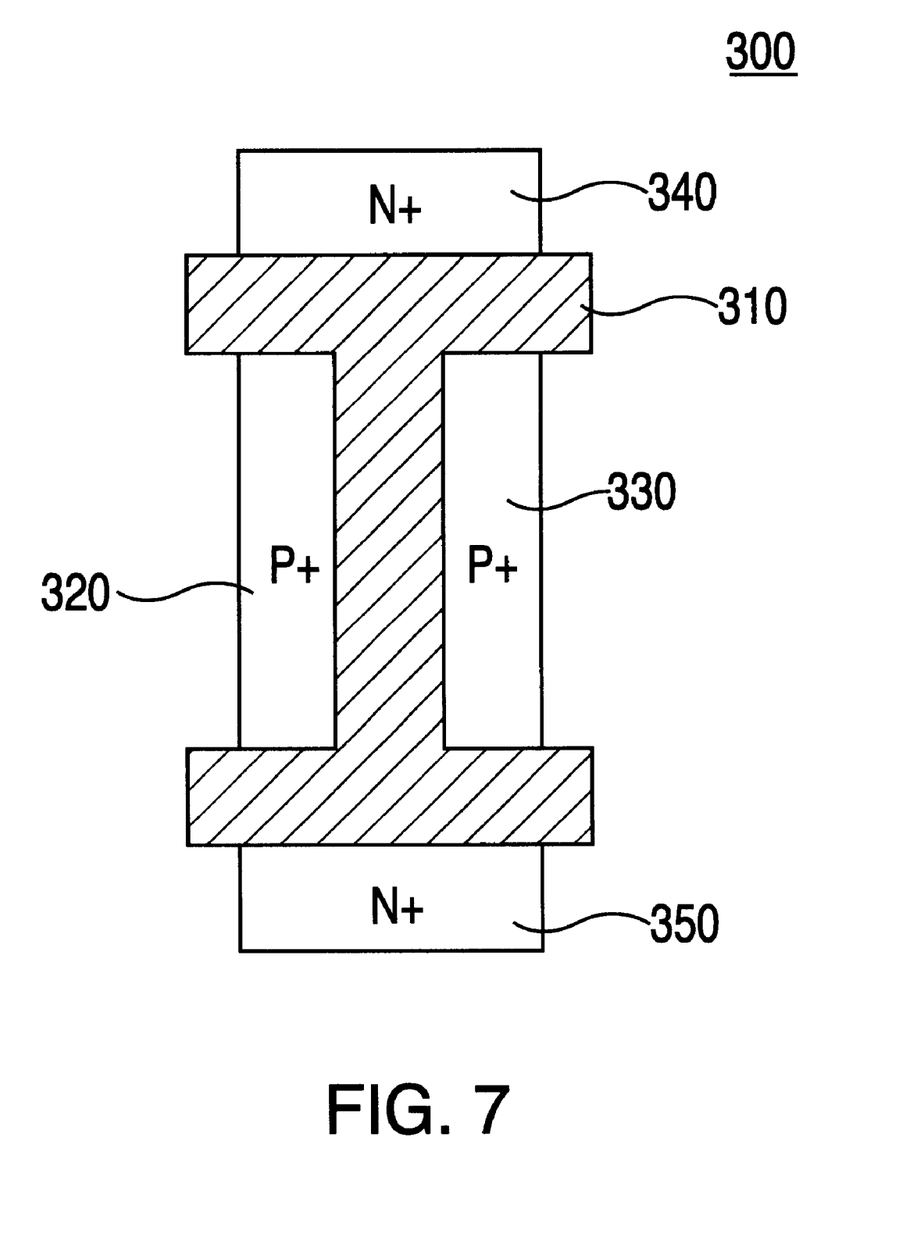
FIG. 7 represents a plan view of a ballasting resistor in accordance with a second preferred embodiment of the present invention.

FIG. 7 represents a plan view of a ballasting resistor 300 incorporating therein an H-shaped gate structure 310 in accordance with a second preferred embodiment of the present invention. The second embodiment of the ballasting resistor 300 is basically identical to the ballasting resistor 100 shown in FIG. 2, excepting that the doping types are reversed. That is, the body region under the gate structure 310 is N⁻ doped, the regions 320, 330 on the sides of the N⁻ body region is P⁺ doped and the nodes 340, 350 are N⁺ doped. The elements of the resistor 300 are reverse-biased as in the resistor 100 in FIG. 2.

Figure 8A:
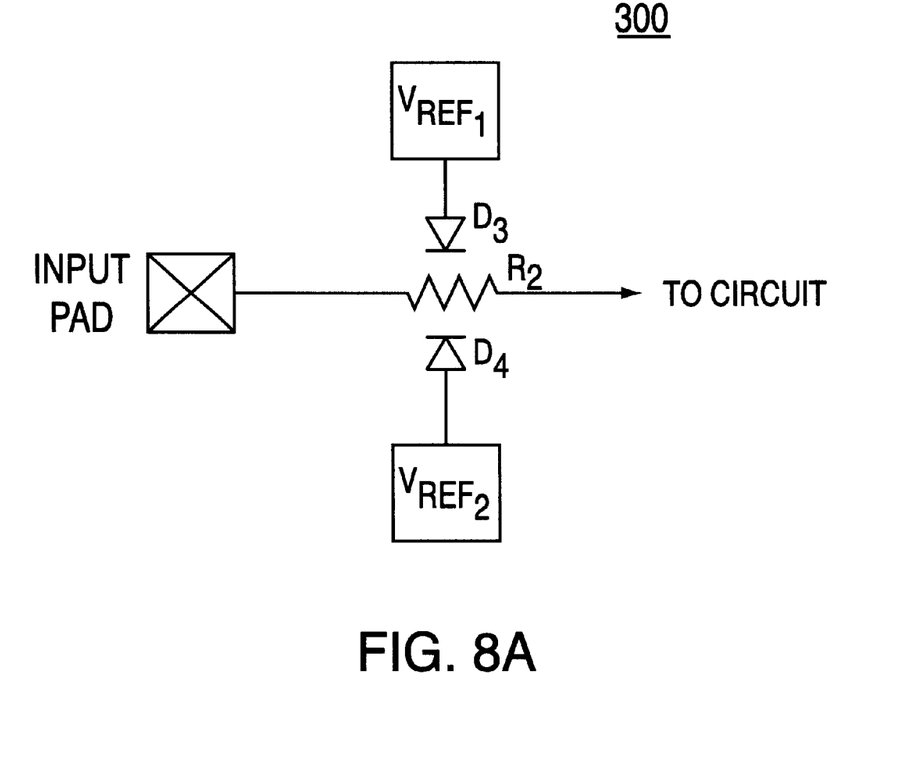
FIGS. 8A to 8C present exemplary ESD protection circuits of the second preferred embodiment of the present invention.
Figure 8B:
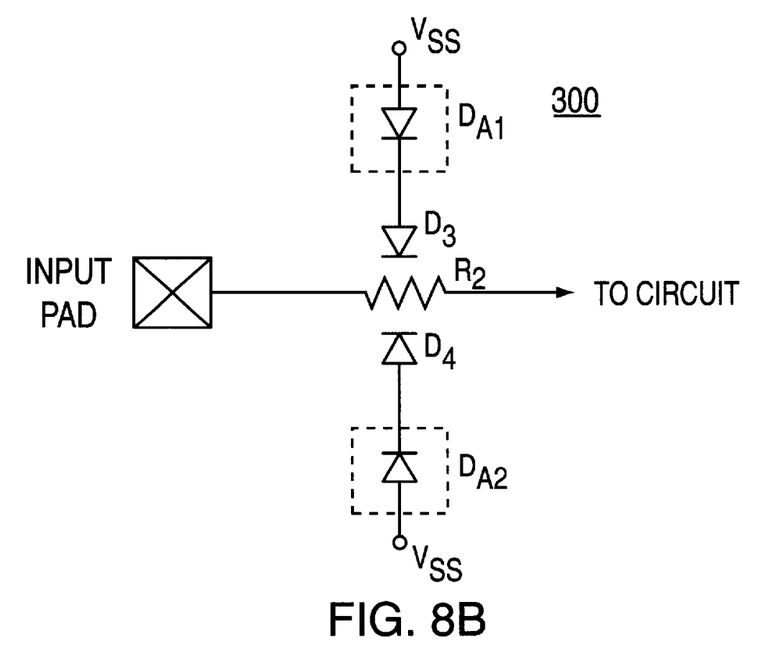
Figure 8C:
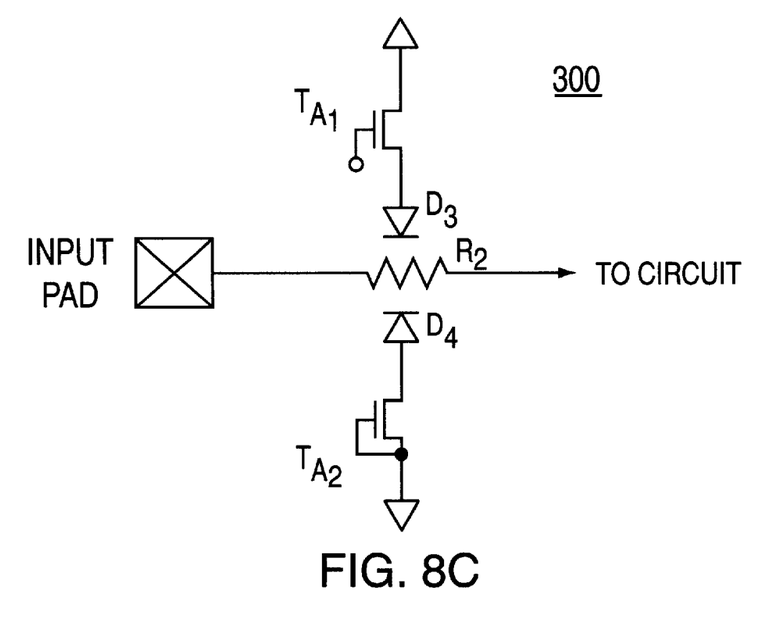

FIGS. 8A to 8C present exemplary circuit embodiments of the resistor 300.

FIG. 8A indicates the ballasting resistor $R_2$ having the structure shown in FIG. 7, wherein there are provided a first and a second reference voltages $V_{ref1}$, $V_{ref2}$, The voltage applied the input pad is different from the $V_{ref1}$ and the $V_{ref2}$. The $V_{ref1}$ and the $V_{ref2}$ can be differently applied to diodes $D_3$ and $D_4$.

A pair of additional diodes $D_{A1}$, and $D_{A2}$ can be connected to the diodes $D_3$ and $D_4$ to control voltages $V_{ss}$ applied to the diodes $D_3$ and $D_4$, respectively, as shown in FIG. 8B. In addition, voltages applied to the $D_3$ and $D_4$ can be controlled by using a pair additional MOSFET transistors $T_{A1}$, $T_{A2}$, as shown in FIG. 8C.

Figure 9:
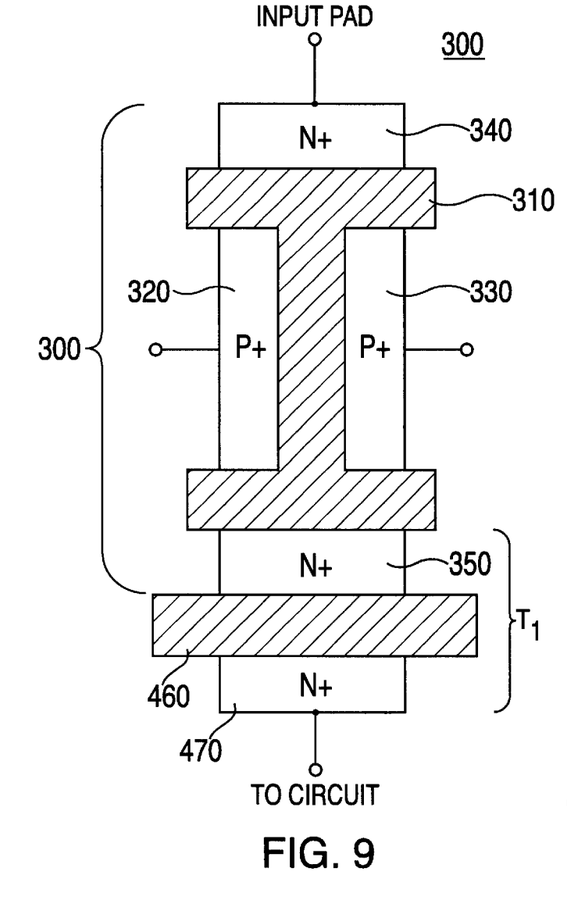
FIG. 9 depicts a ballasting resistor and a MOSFET transistor connected thereto in accordance with the present invention.
Figure 10:
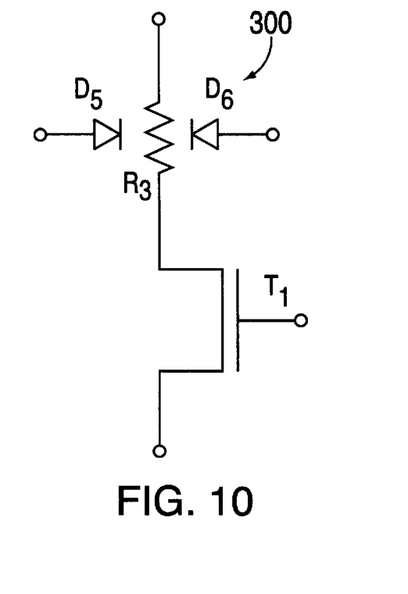
FIG. 10 shows an equivalent circuit of the resistor and the transistor shown in FIG. 9.

FIG. 9 presents the ballasting resistor 300 and a MOSFET transistor $T_1$ connected thereto in accordance with the present invention, wherein a bottom body contact 350 is utilized as a drain of the MOSFET transistor $T_1$. The MOSFET transistor $T_1$ includes a driven gate 460 and a source 470. The H-shaped polysilicon gate 310 is distinct from the driven gate 460 of the MOSFET transistor $T_1$. In this embodiment, the current inputted into a top body contact 340 is pinched down through the resist R3 by applying voltages to the diodes $D_5$ and $D_6$ as shown in FIG. 10, which represents a circuit diagram of the ballasting resistor 300 and the MOSFET transistor $T_1$. Therefore, the ballasting resistor 300 can prevent the MOSFET transistor $T_1$ from an abrupt ESD. It should be noted that the ballasting resistor 300 and the SOI MOSFET transistor $T_1$ can be directly integrated together for resistor balancing.

Figure 11:
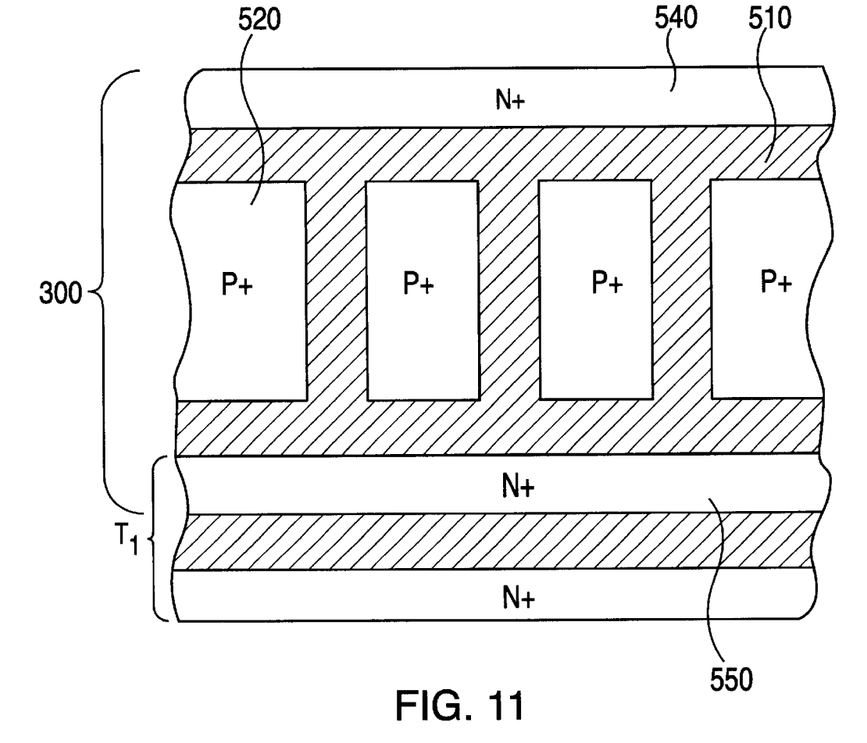
FIG. 11 illustrates a plan view of a ballasting resistor incorporated therein a ladder type gate structure and a MOSFET transistor connected thereto in accordance with the present invention.

FIG. 11 is a plan view of a ballasting resistor 500 in accordance with a third preferred embodiment of the present invention and the MOSFET transistor $T_1$ connected thereto. The ballasting resistor 500 of the third preferred embodiment is similar to the ballasting resistor 300 shown in FIG. 9, excepting that the ballasting resistor 500 is provided with a ladder type gate structure 510 and a number of P⁺ regions 520 formed therebetween. A top and a bottom body contacts 540, 550 are in the form of a line strip and are N⁺ doped. In this preferred embodiment, an H-shaped gate is effectively mirrored successively to produce a larger structure, with a plurality of resistors going into a width of a single MOSFET transistor $T_1$. This will introduce the ballasting resistor 500 within a single finger MOSFET transistor $T_1$. Again, this entire unit itself can be multiplied and connected together in parallel to produce an off-chip driver or peripheral circuits. The gate structure 510 in the shape is effectively a mirror around the $P^+$ shapes. The $P^+$ shapes in the middle are again the elements which act as the biasing elements for pinching down the $N^-$ body region under the structure 510. The bottom contact 550 which may serves as a source or a drain of the MOSFET transistor $T_1$.

As can be noted to one skilled in the art, the inventive ballasting resistors of the invention have MOS transistor-like structures. Therefore, effective ESD protection can be provided for the conventional MOS integrated circuits without employing additional processing steps in accordance with the present invention.

While the present invention has been described with respect to the preferred embodiments, other modifications and variations may be made without departing from the spirit and scope of the present invention as set forth in the following claims.

What is claimed is:

1. A circuit comprising a device for limiting a current, further comprising:
   a current path having a cross section for passing the current therethrough; and
   a pinching means responsive to an applied voltage for reducing the cross section as an amplitude of the applied voltage increases.

2. The circuit of claim 1, wherein the pinching means includes a reverse-biased p-n junction.

3. The circuit of claim 2, wherein the device further includes a second pinching means, which is substantially identical to the other pinching means.

4. The circuit of claim 3, wherein the device is formed on an insulating layer.

5. The circuit of claim 4, wherein the insulating layer is formed on a semiconductor substrate.

6. The circuit of claim 1, wherein the device includes a semiconductor region of a first doping type and two semiconductor regions of a second doping type abutting the semiconductor region of the first doping type, doping concentrations of the semiconductor regions of the second doping type being higher than that of the semiconductor region of the first type doping type, the current path being formed inside the semiconductor region of the first doping region, and each pinching means being formed between the semiconductor region of the first doping type and each semiconductor region of the second doping type.

7. The circuit of claim 6, wherein the device further includes a third pinching means for further reducing the cross section as the amplitude of the applied voltage increases.

8. The circuit of claim 7, wherein the third pinching means includes a dielectric layer formed on the semiconductor region of the first doping type and a conductive layer formed on the dielectric layer.

9. The circuit of claim 8, wherein the device further includes an input node and an output node and the semiconductor region of the first doping type is coupled to the input and the output nodes, each node being formed of a semiconductor material of the first doping type.

10. The circuit of claim 9, wherein the semiconductor region of the first doping type extends between the semiconductor regions of the second doping type and the input and the output nodes.

11. The circuit of claim 10, wherein the third pinching means extends on the extended semiconductor region of the first doping type.

12. A circuit comprising a device formed on an insulating layer for limiting a current, further comprising:
    an input node and an output node formed of a semiconductor material of a first doping type;
    a plurality of discrete semiconductor regions of a second doping type; and
    a semiconductor region of the first doping type, the nodes and the semiconductor regions of the second doping type are coupled each other by the semiconductor region of the first doping type formed therebetween,
    wherein the semiconductor regions of the first and the second types are reverse-biased such that depletion regions inside the semiconductor region of the first doping type increase with an increasing amplitude of an applied voltage to thereby reduce a cross-sectional area through which the current passes.

13. The circuit of claim 12, wherein a doping concentration of the semiconductor region of the first doping type is lower than those of the semiconductor regions of the second doping type.

14. The circuit of claim 13, wherein the device further includes a pinching means, formed on the semiconductor region of the first doping type, for further reducing the cross-sectional area in response to the increasing amplitude of the applied voltage.

15. The circuit of claim 14, wherein the pinching means includes a dielectric layer and a conductive layer formed thereon.

16. A circuit comprising:
    a primary device for conducting a current in response to an applied voltage; and
    a secondary device, coupled in series with the primary device, for limiting the current, the secondary device including:
      a current path having a cross section for passing the current therethrough; and
      a pinching means, responsive to the applied voltage, for reducing the cross section as an amplitude of applied voltage increases, thereby causing an impedance of the secondary device to increase.

17. A circuit comprising:
    a primary device for conducting a current in response to an applied voltage; and
    a secondary device, formed on an insulating layer and coupled in series with the primary device, for limiting the current, the secondary device including:
      an input node and an output node formed of a semiconductor material of a first doping type;
      a plurality of discrete semiconductor regions of a second doping type; and
      a semiconductor region of the first doping type, the nodes and the semiconductor regions of the second doping type are coupled each other by the semiconductor region of the first doping type formed therebetween,
    wherein the semiconductor regions of the first and the second types are reverse-biased such that depletion regions inside the semiconductor region of the first doping type increase with an increasing amplitude of the applied voltage to thereby reduce a cross-sectional area through which the current passes.

18. A structure comprising:

a substrate wafer;

a buried oxide layer on said substrate wafer;

a silicon film on said buried oxide layer;

a H-shape MOSFET gate structure with a gate dielectric;

a spacer;

a polysilicon film;

first and second doped regions of a first conductivity defined by said H-shape MOSFET gate structure;

a channel region of a second conductivity under said gate dielectric;

a first body contact of a second conductivity;

a second body contact of a second conductivity; and a resistive element formed between said first body contact and said second body contact.

19. The structure of claim 18, wherein first and second doped regions are biased to form a pinching means.

20. The structure of claim 19, wherein said structure undergoes velocity saturation providing a first low current resistance value and a second high current resistance value.

21. The structure of claim 20, wherein said structure provides resistor ballasting for over voltage protection.

22. The structure of claim 20, wherein said structure provides resistor ballasting for electrostatic discharge (ESD) events.

23. The structure of claim 20, wherein said structure undergoes a negative resistance saturation from said pinching means.

24. The structure of claim 21, wherein said structure protects an SOI MOSFET transistor.

* * * * *